(12) United States Patent
Bayan et al.

(10) Patent No.: US 7,705,476 B2
(45) Date of Patent: Apr. 27, 2010

(54) INTEGRATED CIRCUIT PACKAGE

(75) Inventors: Jaime A. Bayan, Palo Alto, CA (US);
Anindya Poddar, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 67 days.

(21) Appl. No.: 11/936,017

(22) Filed: Nov. 6, 2007

(65) Prior Publication Data
US 2009/0115035 A1    May 7, 2009

(51) Int. Cl.
*H01L 23/495* (2006.01)
(52) U.S. Cl. .................. 257/787; 257/666; 257/672; 257/674; 257/692; 257/E23.039; 257/E23.043; 257/E23.044; 257/E23.051
(58) Field of Classification Search .................. 257/673, 257/666, 676, 690, 692, 696, 712, 735, 737, 257/738, E21.504, E23.044, 672, 674, 787, 257/E23.039, E23.043, E23.051
See application file for complete search history.

(56) References Cited

U.S. PATENT DOCUMENTS

| | | | |
|---|---|---|---|
| 5,596,225 A | 1/1997 | Mathew et al. | |
| 5,677,567 A | 10/1997 | Ma et al. | |
| 6,080,264 A | 6/2000 | Ball | |
| 6,184,573 B1 * | 2/2001 | Pu | 257/666 |
| 6,204,504 B1 | 3/2001 | Lewis | |
| 6,204,544 B1 | 3/2001 | Ewer et al. | |
| 6,204,554 B1 | 3/2001 | Ewer et al. | |
| 6,297,547 B1 * | 10/2001 | Akram | 257/676 |
| 6,353,257 B1 | 3/2002 | Huang | |
| 6,388,336 B1 | 5/2002 | Venkateshwaran et al. | |
| 6,424,024 B1 | 7/2002 | Shih et al. | |
| 6,479,888 B1 * | 11/2002 | Hirashima et al. | 257/673 |
| 6,518,161 B1 | 2/2003 | Rajagopalan et al. | |
| 6,577,012 B1 | 6/2003 | Greenwood et al. | |
| 6,593,545 B1 | 7/2003 | Greenwood et al. | |
| 6,700,189 B2 | 3/2004 | Shibata | |
| 6,723,585 B1 * | 4/2004 | Tu et al. | 438/123 |
| 6,750,546 B1 | 6/2004 | Villanueva et al. | |
| 6,798,044 B2 | 9/2004 | Joshi | |
| 6,927,483 B1 | 8/2005 | Lee et al. | |
| 6,953,988 B2 | 10/2005 | Seo et al. | |
| 7,064,009 B1 * | 6/2006 | McCann et al. | 438/112 |
| 7,067,904 B2 | 6/2006 | Wang et al. | |
| 7,164,202 B2 | 1/2007 | Wang et al. | |
| 7,250,685 B2 | 7/2007 | Shim et al. | |
| 7,253,508 B2 | 8/2007 | Liu et al. | |
| 2002/0093093 A1 | 7/2002 | Paek | |
| 2003/0071344 A1 | 4/2003 | Matsuzawa et al. | |

(Continued)

OTHER PUBLICATIONS

U.S. Appl. No. 11/691,429, filed Mar. 26, 2007.

(Continued)

*Primary Examiner*—A. Sefer
*Assistant Examiner*—Ermias Woldegeorgis
(74) *Attorney, Agent, or Firm*—Beyer Law Group LLP

(57) ABSTRACT

Integrated circuit (IC) packages are described. Each IC package includes a die having an exposed metallic layer deposited on its back surface. Solder joints are arranged to physically and electrically connect I/O pads on the active surface of the die with associated leads. A molding material encapsulates portions of the die, leadframe and solder joint connections while leaving the metallic layer exposed and uncovered by molding material.

23 Claims, 7 Drawing Sheets

U.S. PATENT DOCUMENTS

| | | | |
|---|---|---|---|
| 2003/0155634 A1 | 8/2003 | Yasunaga et al. | |
| 2005/0156296 A1 | 7/2005 | Wang et al. | |
| 2005/0167855 A1 | 8/2005 | Minamio et al. | |
| 2005/0224945 A1* | 10/2005 | Saito et al. | 257/686 |
| 2006/0105501 A1 | 5/2006 | Kuah et al. | |
| 2007/0262346 A1* | 11/2007 | Otremba et al. | 257/177 |
| 2008/0035959 A1* | 2/2008 | Jiang | 257/204 |
| 2008/0067667 A1* | 3/2008 | Mahler et al. | 257/702 |
| 2008/0135990 A1 | 6/2008 | Coyle et al. | |

OTHER PUBLICATIONS

Office Action in U.S. Appl. 11/961,798 dated May 19, 2009.
Office Action dated Oct. 1, 2009 in U.S. Appl. No. 11/691,429.
U.S. Appl. No. 11/961.798, filed Dec. 20, 2007.
Office Action in U.S. Appl. No. 11/691,429 dated Nov. 28, 2008.
Final Office Action in U.S. Appl. No. 11/691,429 dated Jun. 1, 2009.

* cited by examiner

INTEGRATED CIRCUIT PACKAGE

TECHNICAL FIELD

The present invention relates generally to the packaging of integrated circuits (ICs). More particularly, an exposed IC die package having improved thermal performance is described.

BACKGROUND OF THE INVENTION

There are a number of conventional processes for packaging integrated circuit (IC) dice. By way of example, many IC packages utilize a metallic lead frame that has been stamped or etched from a metal sheet to provide electrical interconnects to external devices. The die may be electrically connected to the lead frame by means of bonding wires, solder bumps that have been preformed on the active surface of the die, or other suitable electrical connections. In general, the die and portions of the lead frame are encapsulated with a molding material to protect the delicate electrical components on the active side of the die while leaving selected portions of the lead frame exposed to facilitate electrical connection to external devices.

In some applications, it is desirable to leave the back surface (opposite the active surface) of the die exposed; that is, not to encapsulate the back surface of the die with molding material. By way of example, it may be desirable to leave the back surface of the die exposed in order to increase heat dissipation out of the die. This is especially relevant for packages used in power applications. Increasing heat dissipation out of an IC die generally results in greater device performance and stability.

While existing arrangements and methods for packaging IC devices work well, there are continuing efforts to improve the thermal performance of IC devices.

SUMMARY OF THE INVENTION

In one aspect, an integrated circuit (IC) package is described. The IC package includes a die having an active surface and a back surface. The active surface includes a plurality of I/O pads. The back surface of the die has an exposed metallic layer deposited thereon. The IC package also includes a leadframe having a plurality of leads. A plurality of solder joints are each arranged to physically and electrically connect a selected one of the I/O pads to an associated lead. At least one of the plurality of leads is a power lead that has a plurality of solder joints coupled thereto such that the power lead is electrically and physically connected to a plurality of the I/O pads. A molding material encapsulates portions of the die, leadframe and solder joint connections while leaving the metallic layer substantially exposed and uncovered by molding material on an outer surface of the package.

In various embodiments, ones of a first set of the plurality of leads each include an inner lead finger portion positioned above the die that extends across the die, a middle lead portion, and an outer lead portion that extends out of the molding material beyond a side of the package. The inner lead finger portions of the first set of leads are arranged in interlaced adjacent rows over the active surface of the die such that a middle and outer portion of each lead of the first set of leads are positioned on an opposite side of the die as the middle and outer lead portions of the leads immediately adjacent to each lead.

Additionally, in some embodiments ones of the first set of leads each have a middle lead portion that is integral to the middle lead portion of at least one other lead of the first set of leads such that the integral middle lead portions form a single middle bus portion that connects at least two inner lead finger portions to at least two outer lead portions. Furthermore, in some embodiments each lead finger portion of a lead from the first set of leads that is intended for coupling to an external power line or an external ground line is connected with at least three I/O pads. By way of example, leads intended for coupling to power or ground lines may be configured to carry at least 1 Watt.

In another aspect, another IC package is described that includes a die, leadframe and solder joints similar to those just described. The IC package additionally includes a second die having an active surface including a plurality of I/O pads and a back surface. The second die is positioned over the first die. At least one I/O pad on the second die is electrically connected with a one of the leads. In some embodiments, at least one I/O pad on the second die is electrically connected with an I/O pad on the active surface of the first die. A molding material encapsulates portions of the dice, leadframe and solder joints while leaving the metallic layer on the first die substantially exposed and uncovered by molding material.

In some embodiments, the back surface of the second die is physically connected with a portion of the active surface of the first die with a suitable non-conductive adhesive layer. In some alternate embodiments, the back surface of the second die is physically connected with top surfaces of leads opposite the solder joints. In still other embodiments, the second die is flip-chip mounted on the first die such that I/O pads on the active surface of the second die are electrically and physically connected with associated I/O pads on the active surface of the first die with solder joints.

In another aspect, an arrangement is described that includes an integrated circuit package as described above. The arrangement also includes a printed circuit board that includes a number of contact surfaces. A plurality of solder joints physically and electrically connect the exposed metallic layer and bottom surfaces of the leads with associated contact surfaces on the printed circuit board.

BRIEF DESCRIPTION OF THE DRAWINGS

For a better understanding of the invention, reference should be made to the following detailed description taken in conjunction with the accompanying drawings, in which.

DETAILED DESCRIPTION OF EXAMPLE EMBODIMENTS

The present invention relates generally to the packaging of integrated circuits (ICs). More particularly, an exposed IC die package having improved thermal performance is described.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

Various embodiments of the present invention will be described with reference to FIGS. 1-6. Aspects of the present invention provide an IC die package that utilizes a lead frame. The I/O pads on the active surface of the die are physically and electrically connected with associated leads of the lead frame with solder ball joints. Each die is packaged such that an exposed metallic layer deposited onto the back surface of the die remains uncovered by molding compound used to encapsulate other portions of the die.

Figure 1A:
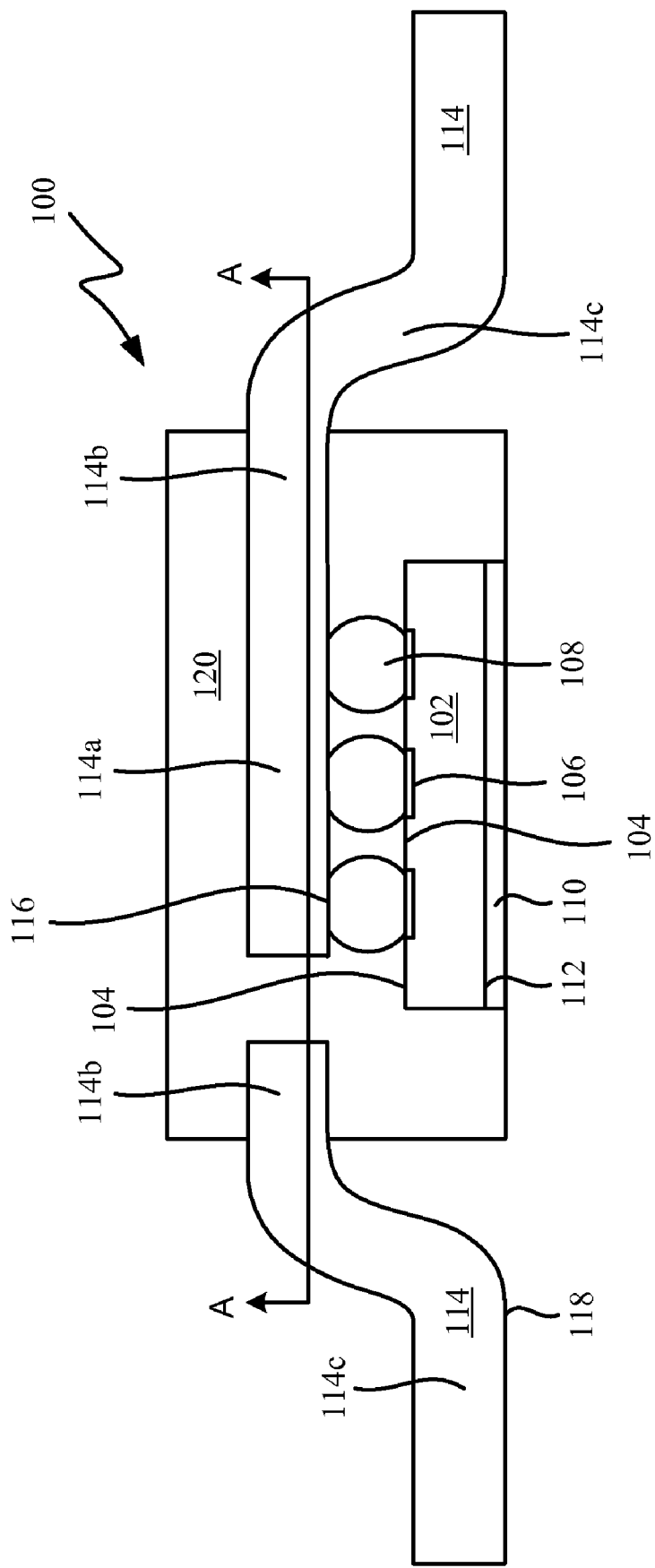
FIGS. 1A-C illustrate diagrammatic cross-sectional side, cross-sectional top and bottom views, respectively, of an IC package in accordance with an embodiment of the present invention.
Figure 1B:
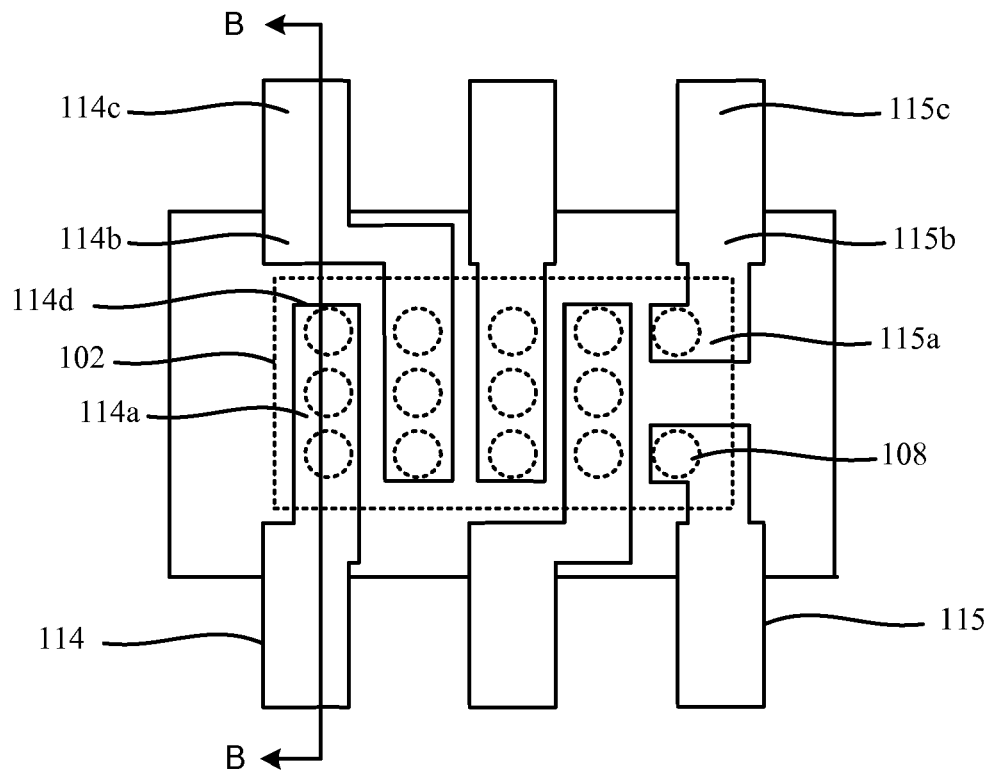
Figure 1C:
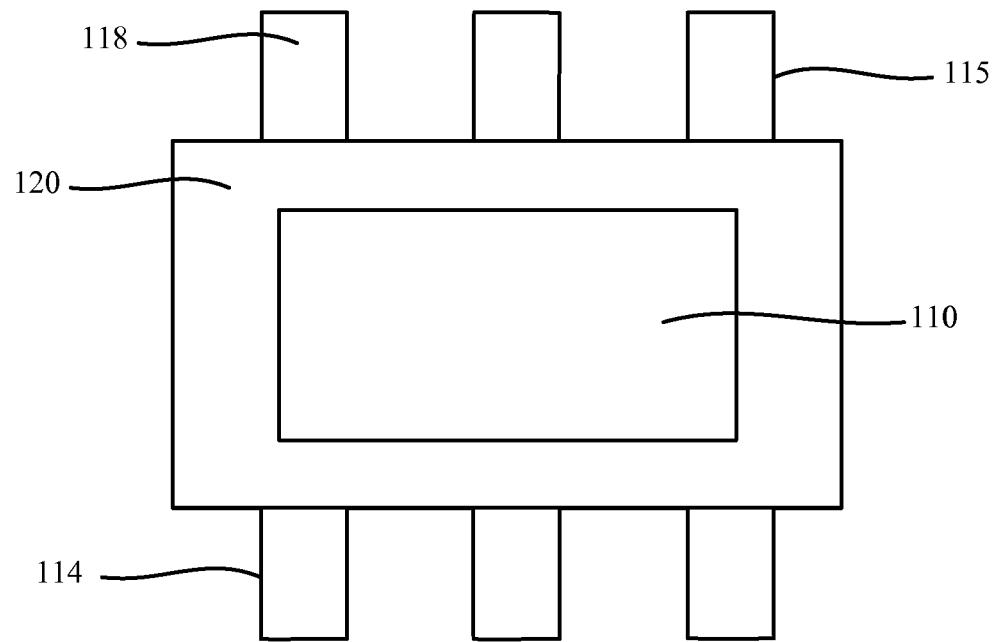

Referring initially to FIGS. 1A-1C, an IC package 100 is described. IC package is particularly suitable for use in power applications. Generally, package 100 is referred to as a flip-chip-on-lead (FCOL) type package. FIG. 1A illustrates a cross-sectional side view of package 100 taken along line B-B of FIG. 1B, which illustrates a cross-sectional top view of package 100 taken along line A-A of FIG. 1A. IC package 100 includes an IC die 102 having an active surface 104 that includes a plurality of bond pads 106 (although the die 102 would be hidden from view, the perimeter of the die 102 is illustrated with a dotted line in FIG. 1B). The bond pads 106 may be the original bond pads on the active surface of the die 202 or other input/output (I/O) pads that have been redistributed from the bond pads using various redistribution techniques (hereinafter, bond pads will be used interchangeably with I/O pads). Additionally, in various embodiments, under-bump metallizations (UBMs) may be formed on the bond pads 106 of the dice 102 prior to solder bumping.

In various embodiments, the IC die 102 includes a thin metallic layer 110 deposited onto the back surface 112 of the die as best illustrated in FIG. 1C, which illustrates the bottom surface of the package 100. The thin metallic layer 110 may be formed from any suitable metal or metallic alloy. By way of example, the thin metallic layer 110 may be an alloy of titanium, nickel and silver. The thin metallic layer 110 may also be applied to the back surface 112 of the die 102 by any suitable means including, for example, sputtering. The metallic layer 110 may serve as a heat dissipation medium for transferring thermal energy out of the die 102. In various embodiments, the back surface 112 of the die 102 is intended to be soldered directly to a desired substrate, such as a PCB, to provide for enhanced heat dissipation out of the die. Since solder does not generally adhere well to Si, the metallic layer serves as an intermediary between the solder and the Si. In other embodiments, such as in analog applications, it is desirable to electrically connect the back surface 112 of the die 102 to a PCB to allow control over the electrical potential of the back region of the die.

Package 100 additionally includes a lead frame having a plurality of leads 114 and 115. Each lead 114 may be configured as a power lead intended for coupling to an external power or ground line. By way of example, power leads 114 may be configured to carry at least approximately 1 Watt. In other applications, each power lead 114 may be configured to carry much higher powers. Each lead 114 includes an inner lead finger portion 114a, a middle lead portion 114b and an outer lead portion 114c. In various embodiments, the leads 114 are arranged such that the inner lead finger portions 114a are arranged in interlaced adjacent rows over the active surface 104 of the die 102. More specifically, the leads 114 may be arranged such that the middle portion 114b and outer portion 114c of each lead 114 is positioned on an opposite side of the die 102 as the middle and outer lead portions of the leads 114 immediately adjacent to the respective lead.

In the embodiment illustrated in FIG. 1B, which illustrates a dual inline package (DIP) format, four leads 114 are arranged such that the four associated inner lead finger portions 114a are arranged in four interlaced rows over the active surface 104 of the die 102. The outer portions 114c of the corresponding leads 114 are arranged such that two of the outer portions 114c of the leads 114 extend from each of two opposite sides of the package 100. In the illustrated embodiment, each lead 114 extends over the die 102 and past the inner lead end 114d of an adjacent lead 114.

Additionally two leads 115 are each arranged on opposite sides of the package 100 as well. The associated inner regions 115a of the leads 115 are positioned in a single row over the active surface 104 of the die 102. The outer portions 115c of the leads 115 are arranged to extend from opposite sides of the package 100. The described arrangement forms a DIP 100 having five rows of leads over the active surface 104 of the die 102 and six corresponding external outer lead portions 114c and 115c, three of which (two outer portions 114c and one outer portion 115c) extend from each of two opposite sides of the package 100.

Each of the inner lead portions 114a and 115a includes at least one conductive solder pad 116. The inner lead portions 114a and 115a are arranged such that the solder pads 116 are positioned over corresponding bond pads 106 on the active surface 104 of the die 102. Each bond pad 106 is physically and electrically connected to one of the associated leads 114 or 115 with a solder ball joint 108. In various embodiments, the outer portions 114c and 115c of the leads 114 and 115 additionally include package contacts 118 on the bottom surfaces of the leads. In some embodiments, the leads 114 and 115 may be etched, half-etched, or otherwise thinned relative to the solder pads 116 and/or package contacts 118.

It will be appreciated by those skilled in the art that, although a specific lead frame arrangement has been described and illustrated, embodiments of the present invention may utilize an extremely wide variety of other lead frame configurations as well. Additionally, although described with references to a top and bottom surface of the lead frame, it should be appreciated that this context is intended solely for use in describing the structure and may not coincide with the final orientation of the lead frame after subsequent attachment to a PCB or other suitable substrate.

In various embodiments, one or more leads 114 are each connected with multiple I/O pads 106 on the active surface 104 of the die 102. By way of example, a single inner lead finger 114a may include multiple solder pads 116, each of which is to be physically and electrically bonded to one of multiple I/O pads 106 designated for connection with power or ground lines. The number of I/O pads 106 connected with each lead 114 may vary widely. By way of example, anywhere from 1 to 8 I/O pads 106 may be connected with corresponding solder pads 116 on a single lead 114. In some high power applications, an even greater number of I/O pads may be connected with a single lead 114. In the embodiment illustrated in FIG. 1B, the leads 114 are each intended for connection to higher current power or ground lines and are each connected with three corresponding I/O pads 106. In contrast, the leads 115 are generally intended for connection to signal or control lines and are each connected with a single I/O pad 106 via a single solder ball joint 108.

In some embodiments, recessed regions are formed around the solder pads 116 of the leads 114 in order to prevent the spread of solder between adjacent solder pads 116 and along other surfaces of each lead. The recessed regions essentially form a moat around each solder pad 116 that serves to isolate the solder pad from the rest of the associated lead surfaces. The recessed regions may be formed by any suitable means. By way of example, the recessed regions may be formed by etching the top surface of the lead frame panel. The formation and use of recessed regions to isolate solder pads is described in more detail in U.S. patent application Ser. No. 11/691,429, which is incorporated by reference herein.

Additionally, in some embodiments a number of the leads 114 may be interconnected with one another such that an even greater number of I/O pads 106 receive and share current through two or more equipotential leads. This type of arrangement will be described in greater detail below with reference to FIG. 4.

As will be appreciated by those familiar with the art, power or ground lines generally carry higher current than other signal or control lines. The aforementioned arrangement allows the current through a single lead 114 to be shared by multiple associated I/O pads 106 and associated solder ball joints 108, thereby increasing the current carrying capability of the die 102 as a whole. The amount of current carried by each solder joint 108 is limited in part by the size of the solder joint (e.g., the diameter of the solder joint). The diameter of the solder joint 108 is, in turn, limited by the size of the corresponding I/O pad 106, which is in turn limited by the available real estate on the active surface 104 of the die 102. More particularly, for a given die footprint, the layout (distribution), size and shape of the I/O pads 106 is limited by the regions on the active surface 104 of the die 102 available for bonding and the total area of the active surface of the die as well as proximity constraints placed on the I/O pads.

Those familiar with the art will appreciate that the current carrying and heat dissipation capabilities of solder ball joints far exceed those of bonding wires. Generally, as the number and diameter of the solder ball joints 108 increase, the current carrying and heat dissipation capabilities of the die 102 increase. Additionally, as the diameters of the solder ball joints 108 increase, the resistance through the solder ball joints decreases. As a result of their larger diameters and the relatively shorter distance traveled through a solder ball joint as compared to a typical bonding wire, the electrical resistance through solder ball joints is far below that of typical bonding wires. By way of example, a typical solder ball joint may have a resistance of approximately 0.5 m$\Omega$ while a corresponding bonding wire used in a similar application may have a resistance in the range of approximately 60 to 100 m$\Omega$.

In the embodiment illustrated in FIGS. 1A-1C, portions of the die 102 and leads 114 and 115 are encapsulated with a molding material or compound 120. The molding compound is generally a non-conductive plastic or resin having a low coefficient of thermal expansion. Package 100 is encapsulated in such a way as to prevent molding material 120 from covering or intruding over the metallic layer 110 on the back surface 112 of the die 102. The molding material does encapsulate other portions of the die 102, the solder joints 108, and generally at least the inner portions 114a and 115b and middle portions 114b and 115b of the leads 114 and 115. In the embodiment illustrated in FIGS. 1A-1C, the outer portions of the leads 114 and 115 extend from the sides of the encapsulated package and are bent into a characteristic gull-wing formation to facilitate electrical connection with a printed circuit board (PCB) or other suitable substrate. Additionally, the package contacts 118 on the bottom surfaces of the leads 114 and 115 are coplanar with the bottom or back surface of the metallic layer 110.

Figure 2:
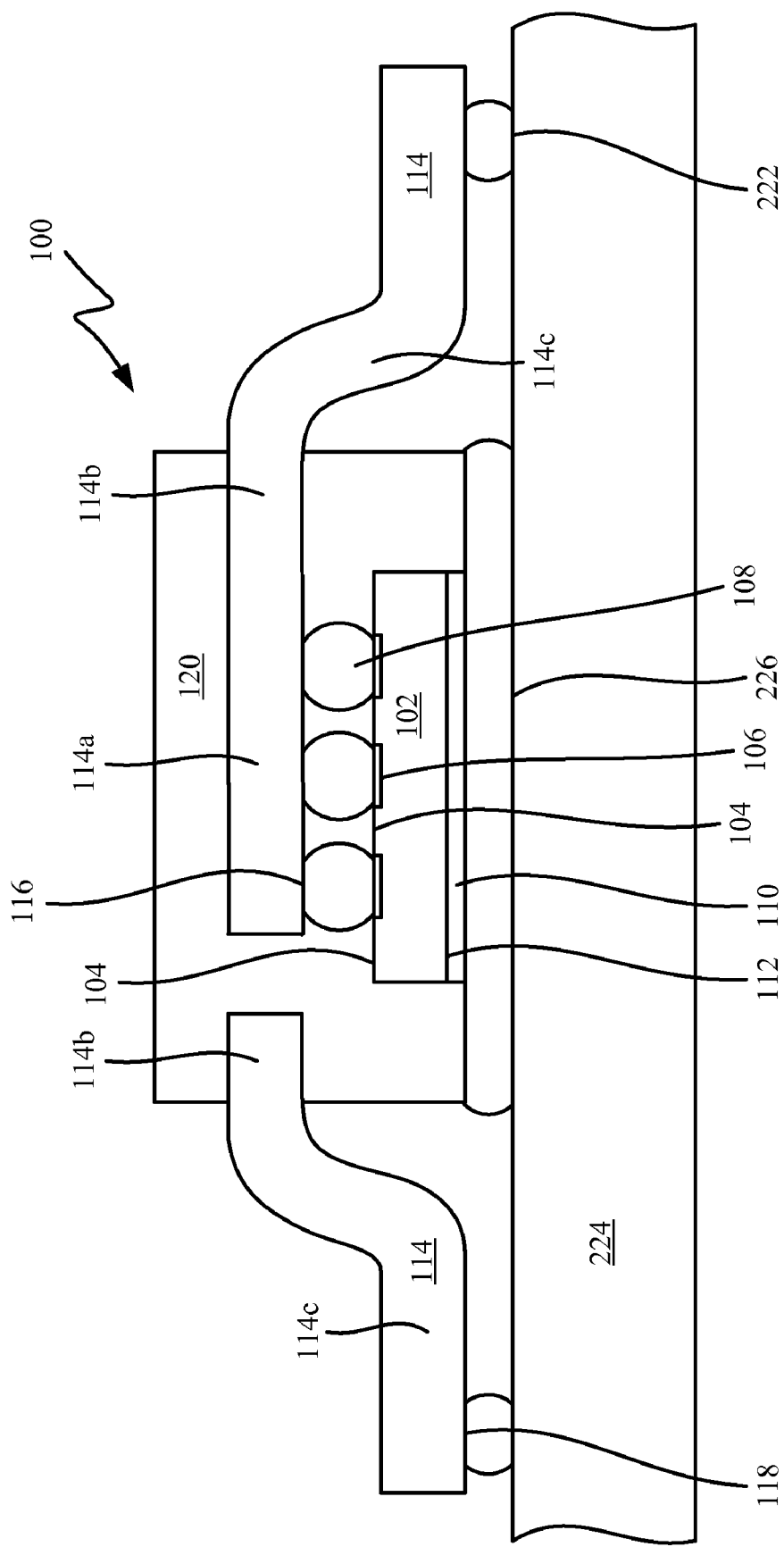
FIG. 2 is a diagrammatic cross-sectional side view of the IC package of FIG. 1 mounted on a PCB in accordance with an embodiment of the present invention.

In the embodiment illustrated in FIG. 2, the package contacts 118 on the bottom surfaces of the leads 114 and 115 of package 100 are physically and electrically connected with corresponding contacts 222 on a PCB 224. In various embodiments, the metallic layer 110 is also physically and electrically connected to an associated contact surface 226 on the PCB 224. This arrangement provides an efficient and direct mechanism for dissipating heat out of the die 102. More particularly, by soldering or otherwise connecting the metallic layer 110 on the back surface 112 of the die 102 to the PCB 224, a direct thermally conductive path is created between the die 102 and the PCB 224. In this way, the contact surface 326 and PCB 224 serves as a heat sink for dissipating thermal energy out of the die 102. As already described, the solder ball joints 108 also provide an efficient thermal path for dissipating thermal energy out of the die 102 via the leads 114 to the contacts 222 on the PCB 224. Thus, embodiments of the present invention provide two efficient means of dissipating heat out of the die 102.

Figure 3:
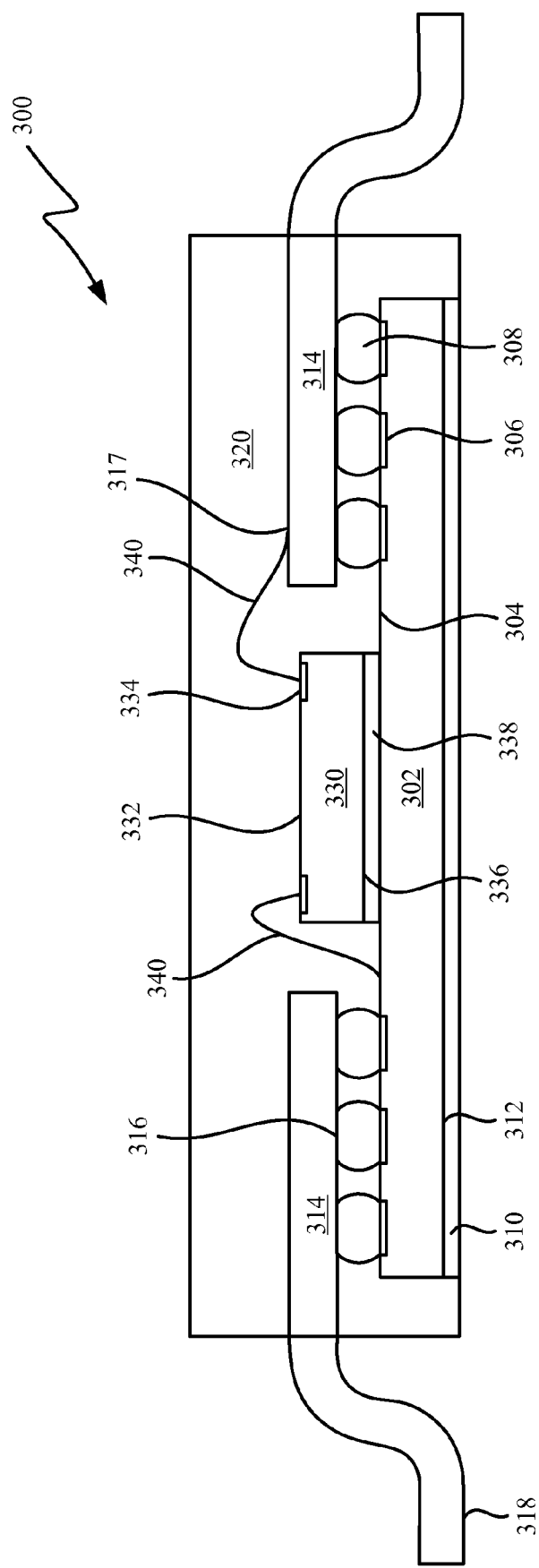
FIG. 3 is a diagrammatic cross-sectional side view of an IC package in accordance with another embodiment of the present invention.

In the embodiment illustrated in FIG. 3, a package 300 is described that includes two dice, one positioned over the other. There are a number of reasons that it may be desirable, in some applications, to include a stacked die arrangement. By way of example, it may be desirable to position a daughter die over a mother die to reduce the footprint of the package. In particular embodiments, an IC package 300 suitable for use in power applications is described. IC package 300 includes a mother IC die 302 having an active surface 304 that includes a plurality of bond pads 306. The bottom (mother) IC die 302 includes a thin metallic layer 310 deposited onto the back surface 312 of the die. In various embodiments, the back surface 312 of the mother die 302 is intended to be soldered directly to a desired substrate, such as a PCB, to provide for enhanced heat dissipation out of the die.

Package 300 additionally includes a lead frame having a plurality of leads 314. In the illustrated embodiment, each of the leads 314 includes a conductive solder pad surface 316. The leads 314 are arranged such that the solder pads 316 are positioned over corresponding bond pads 306 on the active surface 304 of the mother die 302. Each bond pad 306 is physically and electrically connected to one of the associated leads 314 with a solder ball joint 308. In various embodiments, the leads 314 additionally include package contacts 318 on the bottom surfaces of the leads.

In various embodiments, one or more leads 314 are each connected with multiple I/O bond pads 306 on the active surface 304 of the mother die 302. By way of example, a single lead 314 may be bonded to multiple I/O pads 306 designated for connection with power or ground lines. The number of I/O pads 306 connected with each lead 314 may vary widely. In the illustrated embodiment, each of the illustrated leads 314 is positioned adjacent to three associated I/O pads 306 and is connected to the associated I/O pads with associated solder ball joints 308.

IC package 300 also includes a second top (daughter) die 330. In some applications, the daughter die 330 serves as a control chip while the mother die 302 serves as the main chip for receiving and transmitting higher power lines. In this way, the available real estate on the mother die 302 may be utilized to maximize the number of I/O pads 306 designated for connection to power or ground lines while the active surface 332 of the daughter die 330 includes I/O pads 334 designated for connection to signal or control lines.

The daughter die 330 is positioned over the mother die 302. Positioning the daughter die 330 over the mother die 302 may allow the resultant package 300 to have a smaller footprint. Since no die attach pad is used, the stacking of the daughter die 330 over the mother die 302 does not necessarily increase the overall thickness of the package when compared to conventional arrangements. The daughter die 330 may be physically and electrically connected to the mother die 302 and/or the leads 314 with any suitable means. In the embodiment illustrated in FIG. 3, the back surface 336 of the daughter die 330 is physically attached to a portion on the active surface 304 of the mother die 302 that is not occupied by I/O pads 306. Any suitable die attach adhesive or other die attach material 338 may be used to connect the back surface 336 of the daughter die 330 to the active surface 304 of the mother die 302. By way of example, suitable die attach materials include various non-conductive epoxies.

The I/O pads 334 on the active surface 332 of the daughter die 330 may be electrically connected with I/O pads 306 on the active surface 304 of the mother die 302 or to solder pads 317 on the leads 314 with any suitable means. In the illustrated embodiment, bonding wires 340 are used to electrically connect the I/O pads 334 with I/O pads 306 and solder pads 317.

Portions of the mother die 302, the daughter die 330 and the leads 314 are encapsulated with a molding compound 320. Package 300 is encapsulated in such a way as to prevent molding material 320 from covering or intruding over the metallic layer 310 on the back surface 312 of the mother die 302. The molding material does encapsulate other portions of the mother die 302, the daughter die 330, the solder joints 308, the bonding wires 340 and portions of the leads 314. In the embodiment illustrated in FIG. 3, the leads 314 extend from the sides of the encapsulated package 300 and are bent into a characteristic gull-wing formation to facilitate electrical connection with a printed circuit board (PCB) or other suitable substrate. Additionally, the package contacts 318 are coplanar with the metallic layer 310 on the back surface of the mother die 302. In various embodiments, the package contacts 318 on the bottom surfaces of the leads 314 are physically and electrically connected with corresponding contacts on a PCB. In some embodiments, the metallic layer 310 is also physically and electrically connected to an associated contact surface on the PCB.

Figure 4:
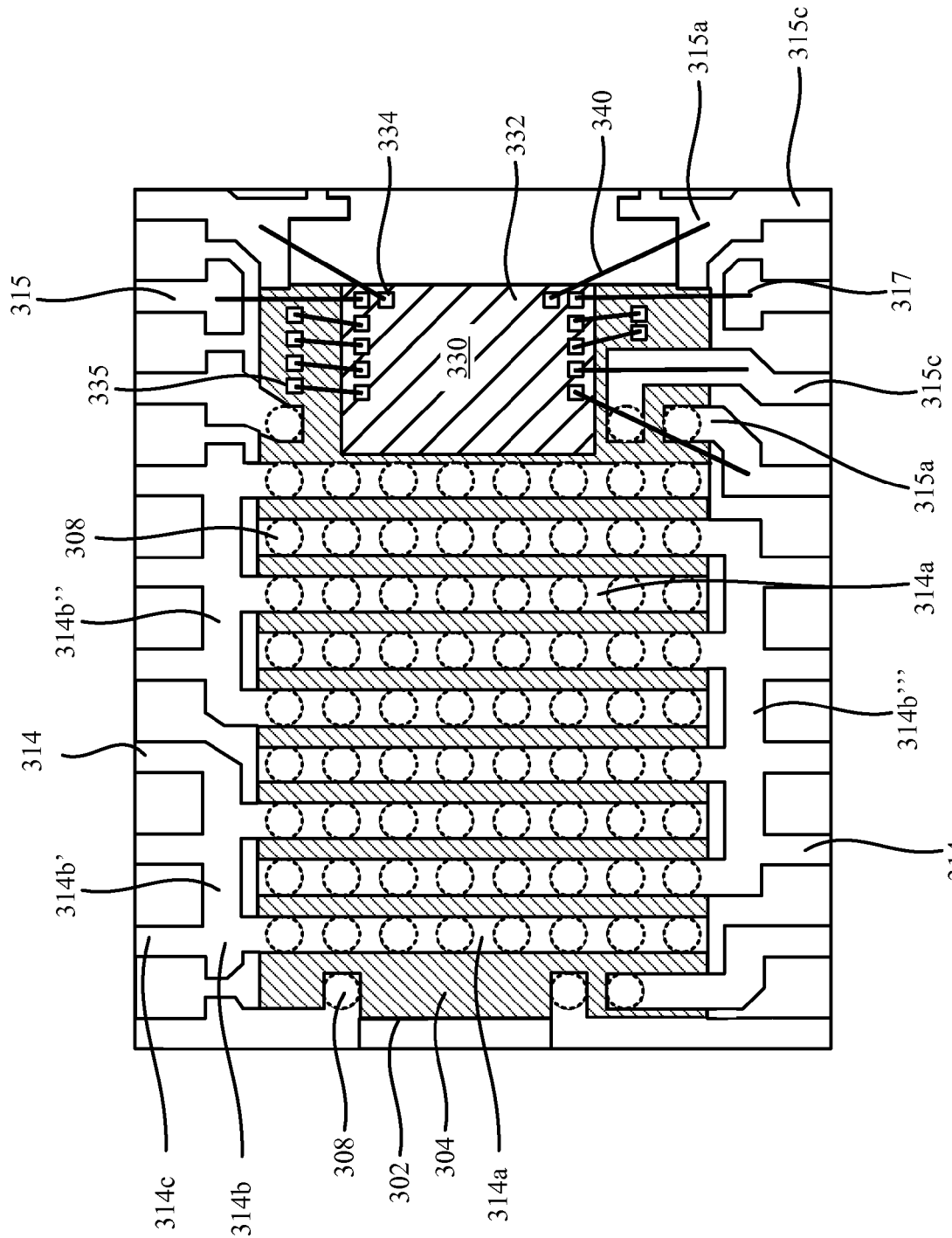
FIG. 4 is a diagrammatic cross-sectional top view of an IC package in accordance with an embodiment of the present invention.

FIG. 4 illustrates a diagrammatic cross-sectional top view of a variant to the embodiment illustrated in FIG. 3. In this embodiment, a bottom mother die 302 having an active surface 304 is intended to carry high power (although the mother die 302 would be hidden from view, the mother die is illustrated with diagonal lines for ease of description). Most of the I/O pads on the active surface 304 of the mother die 302 may be configured for receiving and transmitting high current (high power) and are each connected with one of numerous leads 314. Each lead 314 may be configured as a power lead intended for coupling to an external power or ground line. Each lead 314 includes an inner lead finger portion 314a, a middle lead portion 314b and an outer lead portion 314c. In various embodiments, the leads 314 are arranged such that the inner lead finger portions 314a are arranged in interlaced adjacent rows over the active surface 304 of the mother die 302. More specifically, the leads 314 may be arranged such that the middle portion 314b and outer portion 314c of each lead 314 is positioned on an opposite side of the die 302 as the middle and outer lead portions of the leads 314 immediately adjacent to the respective lead.

In the embodiment illustrated in FIG. 3, which illustrates a dual inline package (DIP) format, nine leads 314 are arranged such that the nine associated inner lead finger portions 314a are arranged in nine interlaced rows over the active surface 304 of the die 302. In the illustrated embodiment, each inner lead finger portion 314a is connected with eight solder ball joints 308 and corresponding I/O pads 306. The outer portions 314c of the corresponding leads 314 are arranged to extend to (or beyond) each of two opposite sides of the package 300. Additionally, the leads 314 may be divided into three groups. More specifically, the first group, including the first and third inner lead finger portions 314a (as viewed from the left), each have associated middle lead portions 314b that are integral with one another and form a single middle bus portion 314b'. Furthermore, the middle bus portion 314b' is connected with three outer lead portions 314c. The second group, including the fifth, seventh and ninth inner lead finger portions 314a, each have associated middle lead finger portions 314b that are integral with one another and form a single middle bus portion 314b''. The middle bus portion 314b'' is also connected with three outer lead portions 314c. Lastly, the third group of leads 314, including the second, fourth, sixth and eighth inner lead finger portions 314a, each have associated middle lead portions 314b that are integral with one another and form a single middle bus portion 314b'''. The middle bus portion 314b''' is connected with four associated outer lead portions 314c. In this way, the first group of leads 314 is connected with sixteen associated I/O pads 306 on the active surface 304 of the die 302, the second group of leads 314 is connected with twenty-four associated I/O pads 306 and the third group is connected with thirty-two associated I/O pads 306.

Additionally, in the illustrated embodiment, ten leads 315 are each arranged on opposite sides of the package 300 as well. These leads 315 are generally intended for connection to signal or control lines. Some of the associated inner portions of the leads 115 may be positioned over and bonded to I/O pads 306 on the active surface 304 of the die 302 via solder joints 308. However, some of the leads 315 are connected with a top die 330, which may be a control die, that is attached to the active surface 304 of the bottom mother die 302. In the illustrated embodiment, I/O pads 334 on the active surface 332 of the top die 330 are electrically connected with I/O pads 335 on the active surface 304 of the bottom die 302 as well as to contact surfaces 317 on top surfaces of leads 315 via bonding wires 340. The outer portions 315c of the leads 315 are arranged to extend to (or beyond) opposite sides of the package 100. The described arrangement forms a DIP 300 having ten external contacts formed from the outer portions 314c and 315c of the leads 314 and 315, respectively.

Figure 5:
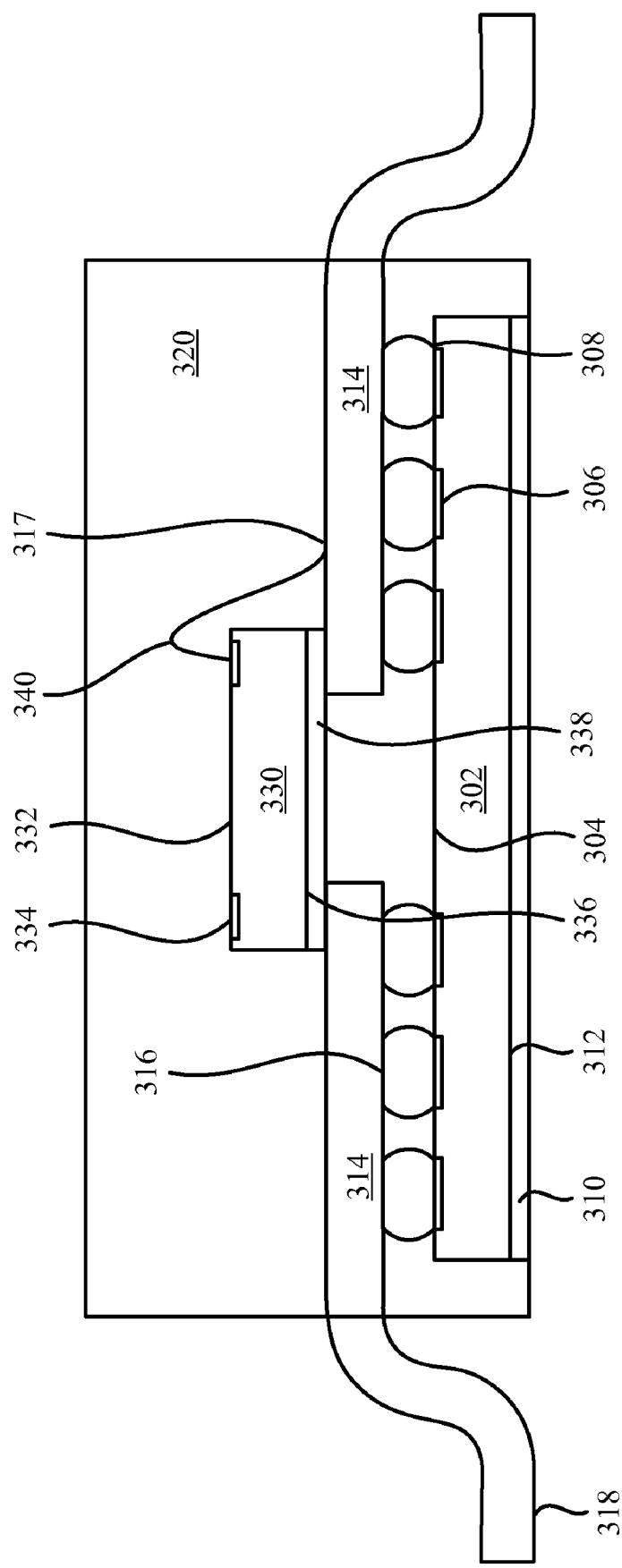
FIG. 5 illustrates an alternate embodiment of the IC package of FIG. 3.
Figure 6:
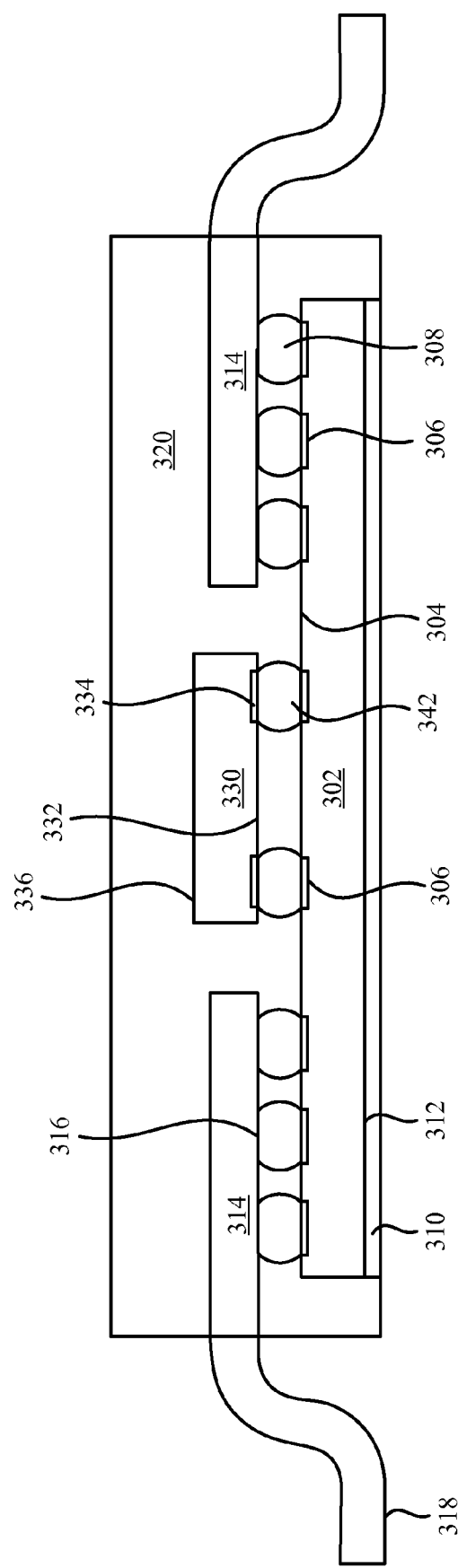
FIG. 6 illustrates an alternate embodiment of the IC package of FIG. 3.

In an alternate embodiment illustrated in FIG. 5, a top die 330 is physically attached to top surfaces of leads 314 with a suitable die attach material 338. I/O pads 334 on the active surface 332 of the top die 330 may be electrically connected with contact surfaces 317 on top surfaces of the leads 314 via bonding wires 340. In this embodiment, virtually the entire active surface 304 of the mother die may be reserved for I/O pads 306 thereby increasing the current carrying and heat dissipation capabilities of the package 300 without necessarily expanding the footprint of the package 300. In another alternate embodiment, the daughter die 330 may be flip-chip attached to the mother die 302, as illustrated in FIG. 6. In this embodiment, the I/O pads 334 on the active surface 332 of the daughter die 330 are physically and electrically connected with I/O pads 306 on the active surface 304 of the mother die 302 with solder joints 342.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An integrated circuit package, comprising:
   a first die, the first die having an active surface and a back surface, the active surface including a plurality of I/O pads, the back surface of the first die having an exposed metallic layer thereon;
   a leadframe having a plurality of leads, each of the plurality of leads having an inner lead end, an inner lead finger portion, a middle lead portion and an outer lead portion, there being gaps between the inner lead finger portions of the plurality of leads, the outer lead portions of the plurality of leads not being directly physically connected;
   a first lead of the plurality of leads, the entire first lead following a single linear, non-branching path that is substantially straight and extends directly between the outer lead portion of the first lead and the inner lead end of the first lead, the inner lead finger portion of the first lead electrically coupled via solder joints to a first plurality of the I/O pads, the first plurality of the I/O pads arranged in a substantially straight line, the first lead being electrically connected to the active surface of the die only through the first plurality of the I/O pads, the outer portion of the first lead being exposed on a first side of the package only at a single location on the first side of the package, no portion of the first lead being exposed on a second side of the package opposite the first side;
   a second lead of the plurality of leads, the entire second lead following a single linear, non-branching path, the second lead extending directly from the outer lead portion of the second lead towards the inner lead end of the first lead, bending around the inner lead end of the first lead and extending alongside and adjacent to the inner lead finger portion of the first lead, the inner lead finger portion of the second lead electrically coupled via solder joints to a second plurality of the I/O pads, the second plurality of the I/O pads arranged in a substantially straight line, the second lead being electrically connected to the active surface of the die only through the second plurality of the I/O pads, the outer lead portion of the second lead being exposed on a second side of the package only at a single location on the second side of the package, no portion of the second lead being exposed on a first side of the package, wherein the inner lead finger portions of the first and second leads are arranged in adjacent rows such that the inner lead finger portion of the first lead extends past the inner lead end of the second lead; and
   a molding material that encapsulates portions of the first die, leadframe and solder joints while leaving the metallic layer substantially exposed and uncovered by molding material on an outer surface of the package.

2. An integrated circuit package as recited in claim 1, wherein ones of a first set of the plurality of leads each include an inner lead finger portion positioned above the first die and extending substantially across the first die, a middle lead portion, and an outer lead portion that extends out of the molding material beyond a side of the package.

3. An integrated circuit package as recited in claim 2, wherein the inner lead finger portions of the first set of leads are arranged in interlaced adjacent rows over the active surface of the first die such that a middle and outer portion of each lead of the first set of leads are positioned on an opposite side of the first die as the middle and outer lead portions of the leads immediately adjacent to each lead.

4. An integrated circuit package as recited in claim 3, further comprising a second die, the second die having an active surface and a back surface, the active surface of the second die including a plurality of I/O pads, the second die being positioned over the first die, at least one I/O pad from the second die being electrically connected with a one of the plurality of leads.

5. An integrated circuit package as recited in claim 2, wherein each lead finger portion of a lead from the first set of leads that is intended for coupling to an external power line or an external ground line is connected with at least three I/O pads.

6. An integrated circuit package as recited in claim 2, wherein at least one lead finger portion of a lead from the first set of leads is electrically and physically coupled to at least 8 different I/O pads.

7. An integrated circuit package as recited in claim 2, wherein outer portions of the leads from the first set of leads are bent or downset into a gull wing formation and wherein bottom surfaces of the outer portions of the leads from the first set of leads are substantially coplanar with the outer surface of the metallic layer.

8. An integrated circuit package as recited in claim 7, wherein the bottom surfaces of the leads and the metallic layer are electrically and physically connected with corresponding contacts on a printed circuit board with solder joints.

9. An integrated circuit package as recited in claim 2, wherein each lead from the first set of leads is configured to carry at least 1 Watt.

10. An arrangement, comprising:
    an integrated circuit package as recited in claim 1;
    a printed circuit board, the printed circuit board including a multiplicity of contact surfaces thereon;
    a plurality of solder joints that physically and electrically connect at least the exposed metallic layer and bottom surfaces of selected leads with associated contact surfaces on the printed circuit board.

11. An integrated circuit package as recited in claim 1, further comprising:
    a first die;
    a plurality of solder joints that are each arranged to physically and electrically connect a selected one of the I/O pads from the first die to an associated lead;
    a second die, the second die having an active surface and a back surface, the active surface of the second die including a plurality of I/O pads, the second die being positioned over the first die, at least one I/O pad from the second die being electrically connected with a one of the plurality of leads; and at least one bonding wire that electrically connects an I/O pad from the second die with one of the plurality of leads.

12. An integrated circuit package as recited in claim 11, wherein at least one I/O pad from the second die is electrically connected with an I/O pad from the first die.

13. An integrated circuit package as recited in claim 11, further comprising at least one bonding wire that electrically connects an I/O pad from the second die with an I/O pad from the first die.

14. An integrated circuit package as recited in claim 11, wherein the back surface of the second die is physically connected with a portion of the active surface of the first die with a suitable non-conductive adhesive layer.

15. An integrated circuit package as recited in claim 11, wherein the back surface of the second die is physically connected with top surfaces of leads opposite the solder joints.

16. An integrated circuit package as recited in claim 11, wherein the second die is flip-chip mounted on the first die, such that I/O pads on the active surface of the second die are electrically and physically connected with associated I/O pads on the active surface of the first die with solder joints.

17. An integrated circuit package as recited in claim 11, wherein at least one of the plurality of leads is a power lead that has a plurality of solder joints coupled thereto such that the power lead is electrically and physically connected to a plurality of the I/O pads from the first die.

18. An integrated circuit package as recited in claim 17, wherein each power lead is configured to carry at least 1 Watt.

19. An arrangement, comprising:
   an integrated circuit package as recited in claim 11;
   a printed circuit board, the printed circuit board including a multiplicity of contact surfaces thereon;
   a plurality of solder joints that physically and electrically connect at least the exposed metallic layer and bottom surfaces of selected leads with associated contact surfaces on the printed circuit board.

20. An integrated circuit package as recited in claim 11, wherein one of the at least one bonding wire forms a direct physical and electrical connection between an I/O pad from the second die and one of the plurality of leads.

21. An integrated circuit package as recited in claim 1, wherein:
   the inner finger portions of the first and second leads are each attached to at least eight of the I/O pads via associated solder bumps and are positioned adjacent to one another; and
   the at least eight of the I/O pads attached to the first lead are arranged to form a single file line that is substantially parallel to a single file line formed by the at least eight of the I/O pads attached to the second lead.

22. An integrated circuit package as recited in claim 1, wherein:
   the inner finger portions of the first and second leads are each attached to at least eight of the I/O pads via associated solder bumps and are positioned adjacent to one another; and
   the at least eight of the I/O pads attached to the first lead are arranged to form a single file line that is substantially parallel to a single file line formed by the at least eight of the I/O pads attached to the second lead; and
   the metallic layer is formed by sputtering a metal directly onto the back surface of the first die.

23. An integrated circuit package as recited in claim 1, further comprising:
   the first lead is exposed at a first, contiguous contact region on the first side of the package, the first lead being electrically isolated from any other region on the first side of the package; and
   the second lead is exposed at a second, contiguous contact region on the second side of the package, the second lead being electrically isolated from any other region on the second side of the package.

* * * * *